United States Patent
Saloio, Jr. et al.

(10) Patent No.: US 9,673,611 B2
(45) Date of Patent: *Jun. 6, 2017

(54) SELF-TEST OF OVER-CURRENT FAULT DETECTION

(75) Inventors: James Saloio, Jr., Ludlow, MA (US); An Nguyen, East Hartford, CT (US)

(73) Assignee: Hamilton Sundstrand Corporation, Windsor Locks, CT (US)

(*) Notice: Subject to any disclaimer, the term of this patent is extended or adjusted under 35 U.S.C. 154(b) by 1023 days.

This patent is subject to a terminal disclaimer.

(21) Appl. No.: 13/401,053

(22) Filed: Feb. 21, 2012

(65) Prior Publication Data

US 2013/0214805 A1   Aug. 22, 2013

(51) Int. Cl.
| | |
|---|---|
| *H02H 3/087* | (2006.01) |
| *H02H 3/04* | (2006.01) |
| *H02H 3/05* | (2006.01) |
| *G01R 31/327* | (2006.01) |
| *H02H 9/00* | (2006.01) |

(52) U.S. Cl.
CPC ........... *H02H 3/087* (2013.01); *G01R 31/327* (2013.01); *H02H 3/044* (2013.01); *H02H 3/05* (2013.01); *H02H 9/001* (2013.01); *H02H 9/005* (2013.01)

(58) Field of Classification Search
CPC ....................................................... H02H 3/044
See application file for complete search history.

(56) References Cited

U.S. PATENT DOCUMENTS

| | | | | |
|---|---|---|---|---|
| 6,798,175 B2* | 9/2004 | Hanada et al. | ............... | 320/166 |
| 7,420,414 B2* | 9/2008 | Suzuki | ........................... | 330/127 |
| 7,843,706 B2 | 11/2010 | Suzuki et al. | | |
| 7,940,507 B2* | 5/2011 | Fukushi et al. | ................. | 361/94 |
| 8,699,356 B2 | 4/2014 | Smart et al. | | |
| 2006/0290333 A1 | 12/2006 | Fukushi et al. | | |
| 2008/0150369 A1 | 6/2008 | Suzuki et al. | | |
| 2011/0194217 A1* | 8/2011 | Davis et al. | .................... | 361/18 |
| 2012/0116482 A1* | 5/2012 | Linder et al. | .................. | 607/62 |

FOREIGN PATENT DOCUMENTS

| | | |
|---|---|---|
| EP | 1763137 A2 | 3/2007 |
| GB | 961882 | 6/1964 |

OTHER PUBLICATIONS

European Office Action for EP Application No. 13176489.6, dated Oct. 10, 2016, 6 pages.
Extended European Search Report, for European Patent Application No. 13153082.6, dated Nov. 2, 2016, 12 pages.
Partial European Search Report, for European Patent Application No. 13153082.6, dated Jul. 28, 2016, 6 pages.

* cited by examiner

*Primary Examiner* — Arleen M Vazquez
*Assistant Examiner* — Feba Pothen
(74) *Attorney, Agent, or Firm* — Kinney & Lange, P.A.

(57) ABSTRACT

A system for testing over-current fault detection includes a first switch to connect a voltage to a load, a capacitor connected between the first switch and ground, a monitor circuit that monitors a current from the first switch to the load, and a microcontroller configured to detect an over-current fault condition based upon input from the monitor circuit. The microcontroller controls the state of the first switch to connect voltage to the load and verifies over-current detection based upon current generated during charging of the capacitor.

11 Claims, 5 Drawing Sheets

SELF-TEST OF OVER-CURRENT FAULT DETECTION

BACKGROUND

The current invention is related to over-current fault detection, and in particular to a system and method for testing over-current fault detection in the field.

Excitation circuits are often used to control the application of power to a load. These circuits include switches which can be enabled or disabled to provide or cut off power to a load respectively. Excitation circuits, especially in critical systems such as those for jet engines, need to have over-current fault detection circuitry. In critical systems with multiple loads, it is also important to be able to isolate the specific fault from affecting the remaining system by switching off the excitation to only the individual faulted load.

An over-current fault is a fault in which there is an excess current flowing through a conductor. This excess current can be created by, among other things, a short-circuit fault in the load. Over-currents create excessive heat, which in turn creates a risk of fire or other damage to equipment. Therefore, it is necessary to detect over-current faults so that they can be handled and damage to the system can be prevented.

In the past, over-current fault handling has been tested by applying an external fault to the system. Because of this, the over-current fault handling circuitry could not be tested in the field. Testing could only occur during times when an external fault could be applied to the system. Therefore, if any problems arose in the over-current detection circuitry during normal system operation, those problems would not be detected and thus, any over-current faults would go unregulated. Further, test equipment used to apply an external fault increases overhead and production test costs.

SUMMARY

A system and method for testing over-current fault detection includes a first switch to connect voltage to a load; a capacitor connected between the first switch and ground; a monitor circuit that monitors current from the first switch to the load; and a microcontroller. The microcontroller is configured to detect an over-current fault condition based upon input from the monitor circuit, wherein the microcontroller controls the state of the first switch to connect voltage to the load and verifies over-current detection based upon current generated during charging of the capacitor.

DETAILED DESCRIPTION

The present invention describes an excitation circuit with over-current fault detection that provides an ability to self-test the over-current fault detection in the field. In particular, the system includes high-side and low-side switches, a microcontroller, a difference amplifier, a comparator, a resistor, and a capacitor. The microcontroller contains logic to detect an over-current fault and control the high-side and low-side switches. Together, the resistor and capacitor act as a filtered current monitor during normal operation. During the over-current self test, the initial charging of the capacitor is used to force an over-current test condition.

Figure 1:
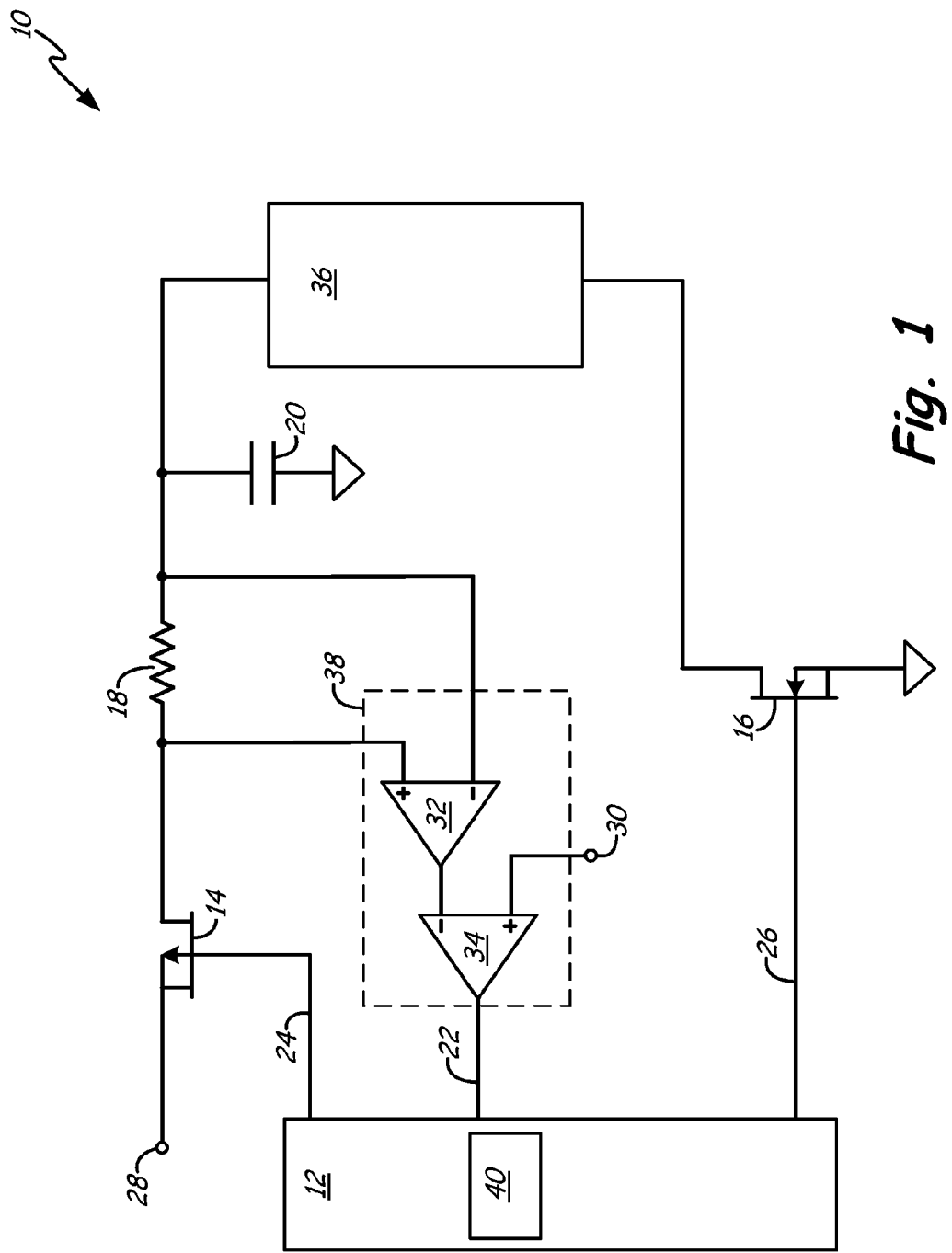
FIG. 1 is a block diagram illustrating an embodiment of the present invention.

FIG. 1 is a block diagram illustrating an embodiment of excitation system 10. System 10 includes microcontroller 12, high-side switch 14, low-side switch 16, resistor 18, capacitor 20, over-current line 22, high-side switch enable line 24, low-side switch enable line 26, voltage terminal 28, reference voltage 30, difference amplifier 32, comparator 34, external load 36, monitor circuit 38, and transient filter 40. High-side switch 14 and low-side switch 16 are illustrated as metal-oxide semiconductor field effect transistors (MOSFETs), but may be implemented using any other known switching technology. Microcontroller 12 may be implemented using a field programmable gate array (FPGA).

During normal system operation, high-side switch 14 and low-side switch 16 are used to excite external load 36. High-side switch 14 is first enabled to provide a voltage to external load 36. Low-side switch 16 is then enabled to excite external load 36 by providing a path to ground. Microcontroller 12 is programmed with digital logic to control the enablement of high-side switch 14 and low-side switch 16. Microcontroller 12 may also be connected to receive instructions from a microprocessor such as a digital signal processor (DSP).

Monitor circuit 38, microcontroller 12, and resistor 18 are used to detect an over-current fault during operation of system 10. Monitor circuit 38 includes difference amplifier 32 and comparator 34 which are used to monitor current through resistor 18. While illustrated using a difference amplifier and a comparator, monitor circuit 38 may be designed using any number of implementations capable of monitoring current through resistor 18 known in the art. Voltages on each side of resistor 18 are input into difference amplifier 32. The output of difference amplifier 32 is input into comparator 34 and compared to a reference voltage 30. Reference voltage 30 may be obtained from a supply voltage and set using, for example, a resistor voltage divider circuit. Reference voltage 30 is chosen such that it is less than the output of difference amplifier 32 if there is a larger than expected current through resistor 18. Because reference voltage 30 is input into comparator 34 at the positive terminal, the output of comparator 34 will be active-low, meaning it will provide a logic zero to indicate an over-current condition. Alternate embodiments may be implemented such that the output of comparator 34 will be active-high. This output, on over-current line 22, is input into microcontroller 12.

Microcontroller 12 includes transient filter 40 to handle any temporary spikes in current caused by, for example, a lighting strike on an aircraft. This way, systems do not need to be interrupted due to a false over-current detection for temporary spikes in current that can be expected during normal system operation. Because of this, microcontroller 12 waits a predetermined over-current fault time ($T_{over-current}$), such as 55 microseconds, before indicating an over-current fault condition. If the signal on over-current line 22 indicates an over-current condition for greater than $T_{over-current}$, microcontroller 12 disables high-side switch 14 and indicates a detected over-current fault. This indication may be accomplished by setting a software readable bit, illuminating a light-emitting diode (LED), or providing any other type of indication of the fault. In separate embodiments, microcontroller 12 may also disable low-side switch 16 immediately upon detection of an over-current fault.

Capacitor 20 is included in order to allow excitation system 10 to self-test the functionality of the over-current fault detection circuitry prior to normal system operation. To initiate a test, capacitor 20 must be discharged. Low-side switch 16 may be enabled for a short period of time in order to discharge capacitor 20. Upon enablement of high-side switch 14, capacitor 20 will charge. During charge-up, capacitor 20 initially acts as a short to ground which creates a large in-rush current through resistor 18 that exceeds the expected steady-state current drawn by external load 36 during normal operation. The circuit values of resistor 18 and capacitor 20, and the scaling of monitor circuit 38 can be selected to ensure that an over-current condition is created through resistor 18 during charge-up of capacitor 20.

A test of the functionality of the over-current fault detection circuitry comprises enabling high-side switch 14 for a time greater than $T_{over-current}$ when capacitor 20 is not yet charged. A successful test occurs if microcontroller 12 indicates an over-current fault during this time period. Following a successful test, high-side switch 14 may be enabled indefinitely, as described below, for normal system operation. If a fault is not detected, system 10 may disable, and then re-enable high switch 14 again for a time greater than $T_{over-current}$. This process may be repeated a predetermined number of times. If an over-current fault has not been indicated after the process has been repeated the predetermined number of times, then the test has failed and proper action can be taken, such as alerting a technician so that the circuit may be repaired or replaced.

Figure 2:
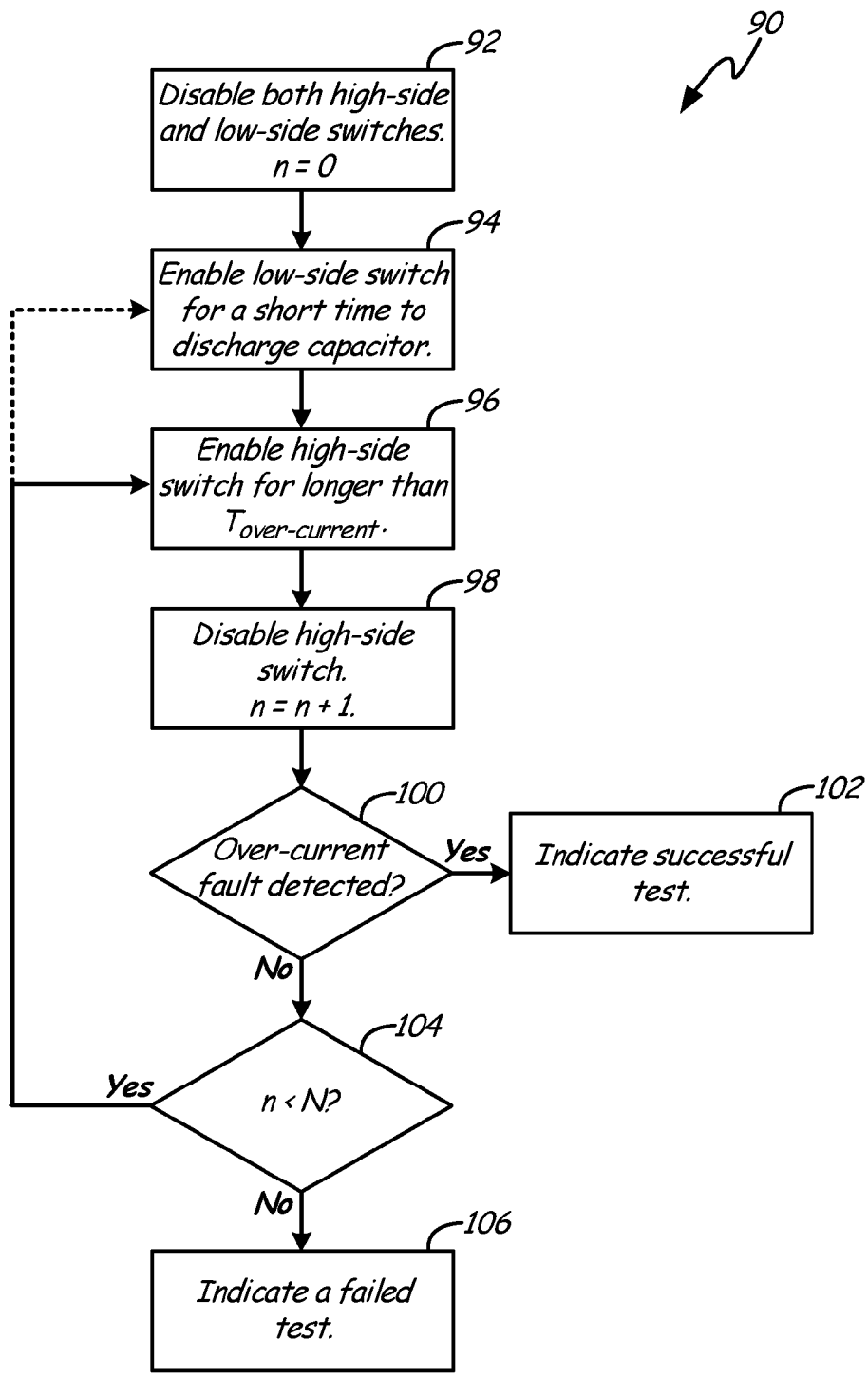
FIG. 2 is a flow chart illustrating a method of testing over-circuit detection circuitry based upon an embodiment of the present invention.

FIG. 2 is a flowchart illustrating a method 90 for testing the functionality of the over-current fault detection of excitation system 10 according to an embodiment of the present invention. At step 92, both high-side switch 14 and low-side switch 16 are disabled. At step 94, low-side switch 16 is enabled for a short period of time to discharge capacitor 20. In embodiments for which it is known that capacitor 20 is already discharged, step 94 may be omitted. At step 96, high-side switch 14 is enabled for a time greater than $T_{over-current}$, such as a time approximately 30% greater than $T_{over-current}$. At step 98, high-side switch 14 is disabled. At step 100, it is determined if microcontroller 12 has detected an over-current fault. If an over-current fault has been indicated, method 90 proceeds to step 102. If an over-current fault has not been indicated, method 90 proceeds to step 104. At step 102, a successful test is indicated. At step 104, if steps 96 and 98 have been completed greater than a predetermined number of retry attempts (N), then method 90 proceeds to step 106 and microcontroller 12 indicates that the test has failed. Otherwise, method 90 returns to step 96. Optionally, as illustrated by the dashed line in FIG. 2, method 90 can return to step 94 to ensure capacitor 20 is fully discharged for each of the predetermined number of retry attempts (N). The predetermined number of retry attempts (N) may be any number determined to be sufficient to indicate a failed test.

Capacitor 20 has no charge when initially enabling high-side switch 14 for normal system operation. Normal system operation comprises keeping high-side switch 14 enabled indefinitely such that low-side switch 16 may be enabled and disabled to excite external load 36 as required by system 10. Because enabling high-side switch 14 creates an over-current condition when capacitor 20 is not charged, the signal on high-side switch enable line 24 must be modulated on and off when enabling high-side switch 14 for normal system operation. Each high-side switch enable pulse must be less than $T_{over-current}$ so as not to create a false over-current fault. The signal on high-side switch enable line 24 is pulsed until capacitor 20 is charged to a voltage such that enablement of high-side switch 14 for greater than $T_{over-current}$ will not cause an over-current fault condition. High-side switch 14 then remains enabled for the rest of normal system operation so that capacitor 20 remains charged and external load 36 may be excited by enabling low-side switch 16 as necessary.

Figure 3A:
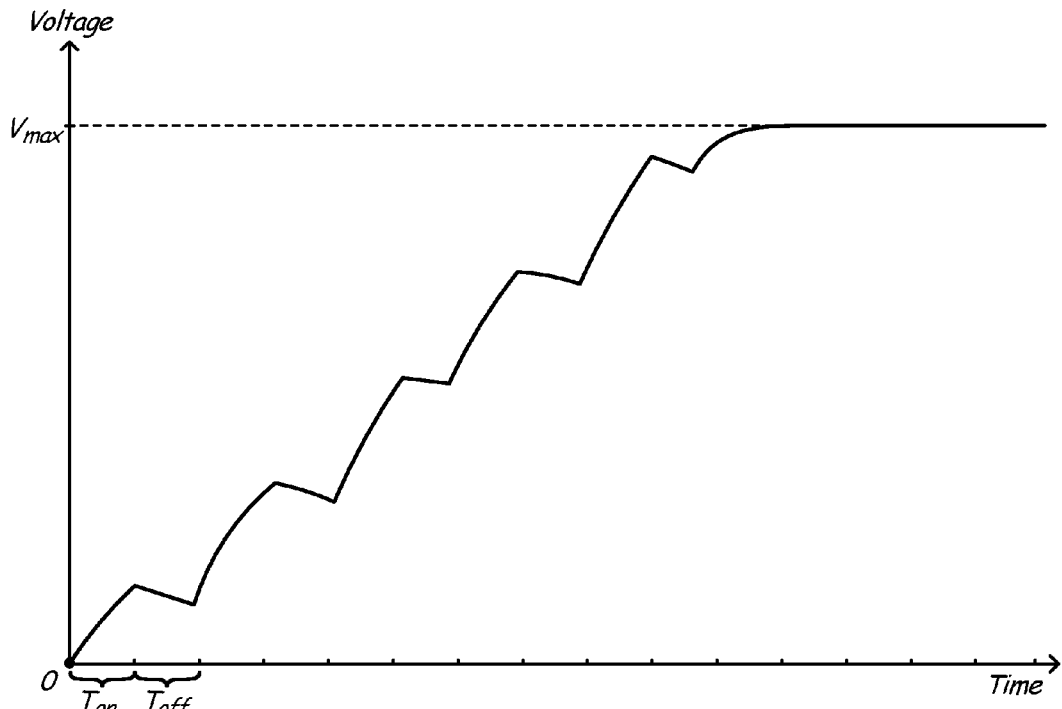
FIGS. 3A-3D are charts illustrating a voltage of a capacitor, a high-side switch enable signal, a low-side switch enable signal, and an over-current signal over time according to an embodiment of the present invention.

FIG. 3A is a chart illustrating the voltage of capacitor 20 during enablement of high-side switch 14 for normal system operation. The y-axis is the value of the voltage of capacitor 20, and the x-axis is time. $V_{max}$ is a value roughly equal to the input voltage on voltage terminal 28. $T_{on}$ is the amount of time the high-side switch is enabled for each pulse. $T_{off}$ is the amount of time the high-side switch is disabled for each pulse. In the present embodiment, $T_{on}=T_{off}$. The value of $T_{on}$ may be, for example, 20 microseconds. $T_{on}$ must be less than $T_{over-current}$ so as not to trigger an over-current fault.

Figure 3B:
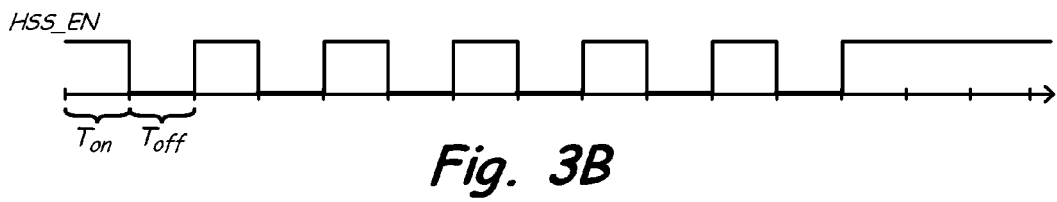

FIG. 3B is a chart illustrating a value on high-side switch enable line 24 during enablement of high-side switch 14 for normal system operation. High-side switch 14 may be pulsed a predetermined number of times such that it is guaranteed that capacitor 20 will be fully charged. Although illustrated as 6 pulses, this predetermined number of pulses is determined based upon the voltage of voltage terminal 28, the resistance of resistor 18, the capacitance of capacitor 20, and the internal resistance of high-side switch 14. After this predetermined number of times, high-side switch 14 may be enabled indefinitely for normal system operation.

Figure 3C:

FIG. 3C is a chart illustrating the value on low-side switch enable line 26 during enablement of high-side switch 14 for normal system operation. Low-side switch enable line 26 is held low to disable low-side switch 16 until capacitor 20 is fully charged. Following enablement of high-side switch 14 for normal system operation, low-side switch 16 may be enabled and disabled at any time to excite external load 36 as required by system 10. Low-side switch 16 is enabled by setting the signal on low-side switch enable line 26 high.

Figure 3D:
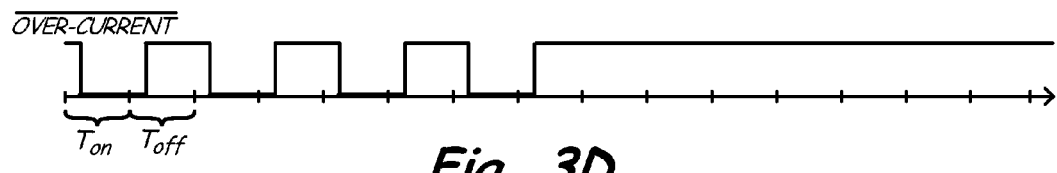

FIG. 3D is a chart illustrating the value on over-current line 22 during enablement of high-side switch 14 for normal system operation. When high-side switch 14 is enabled, as depicted in FIG. 3B, the value on over-current line 22 goes low to indicate an over-current condition due to the in-rush current through capacitor 20. When high-side switch 14 is disabled, the value on over-current line 22 goes high to indicate no over-current condition is present. Once capacitor 20 is charged to a high-enough value, the value on over-current line 22 remains high, indicating that no over-current condition is present due to in-rush current through capacitor 20.

Figure 4:
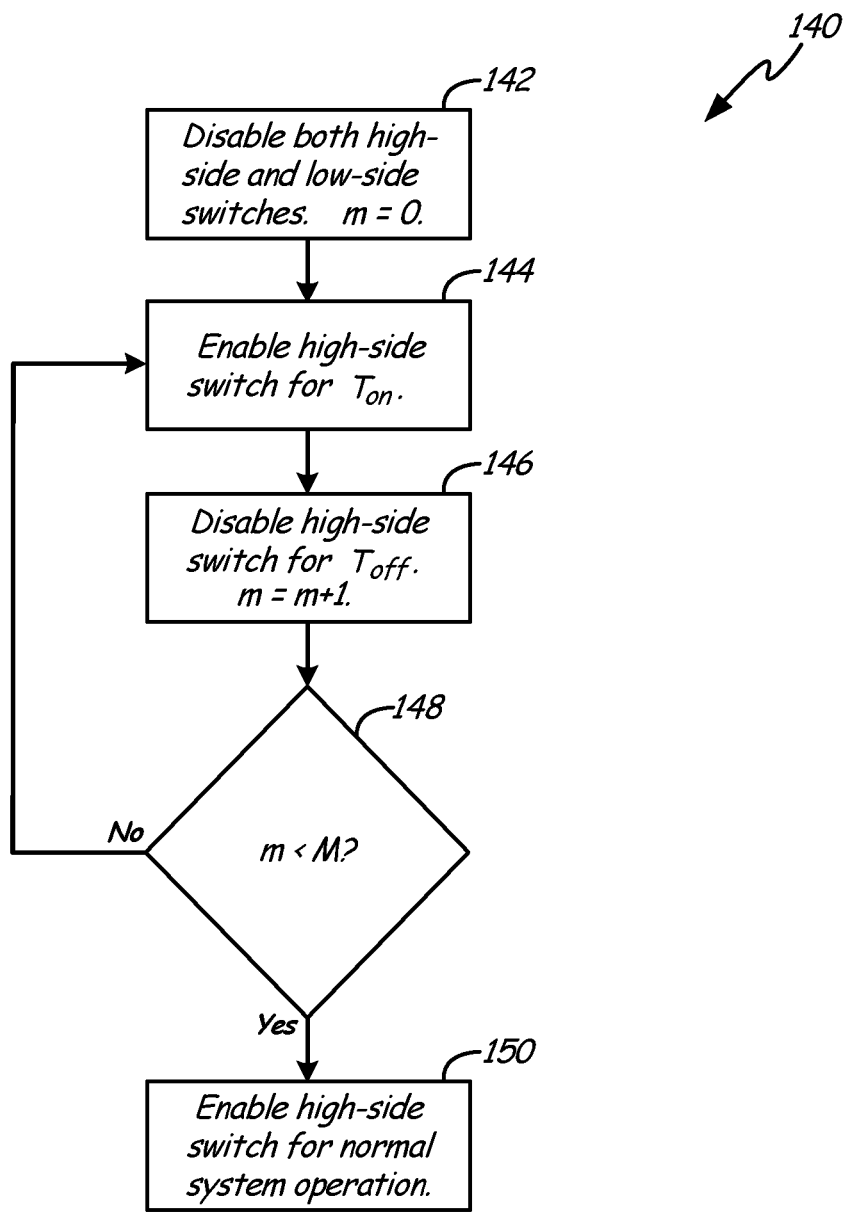
FIG. 4 is a flow chart illustrating a method of enabling a high-side switch according to an embodiment of the present invention.

FIG. 4 is a flowchart illustrating a method 140 of enabling high-side switch 14 for normal system operation. At step 142, high-side switch 14 and low-side switch 16 are disabled. At step 144, high-side switch 14 is enabled for $T_{on}$. At step 146, high-side switch 14 is disabled for $T_{off}$. At step 148, it is determined if high-side switch 14 has been pulsed a predetermined number of times (M) that ensures that capacitor 20 is sufficiently charged based on the given circuit characteristics of high-side switch 14, resistor 18, and capacitor 20. If high-side switch 14 has been pulsed the predetermined number of times (M) then method 140 proceeds to step 150 and high-side switch 14 may be enabled indefinitely for normal system operation. If high-side switch 14 has not been pulsed the predetermined number of times (M), method 140 returns to step 144. In the present embodiment, $T_{on}$ is equal to $T_{off}$. It may be advantageous in some systems to set the high-side switch disable time longer, for example, than the high-side switch enable time in order to further control or limit the average current into capacitor 20 and to limit the corresponding average circuitry power during the entirety of method 140.

Alternatively, the signal on over-current line 22 may be used as feedback to determine when high-side switch 14 may be enabled indefinitely for normal system operation. Once capacitor 20 is charged to a high enough level, an over-current condition will no longer be seen on over-current line 22 due to in-rush current through capacitor 20. Therefore, while pulsing the enable signal for high-side switch 14, microcontroller 12 may monitor the input from over-current line 22 to determine when capacitor 20 has been charged to a level such that the in-rush current will not create an over-current condition. If the signal on over-current line 22 is active-high when high-side switch 14 is enabled, microcontroller 12 will know that high-side switch 14 may be enabled indefinitely for normal system operation. Using over-current line 22 as feedback to determine when high-side switch 14 may be enabled indefinitely is useful in applications where load 36 or the conductor connecting power to load 36 has an unknown or varying capacitive element that adds to capacitor 20 and, therefore, makes it impractical to determine a pre-determined number of pulses as used by method 140.

Figure 5:
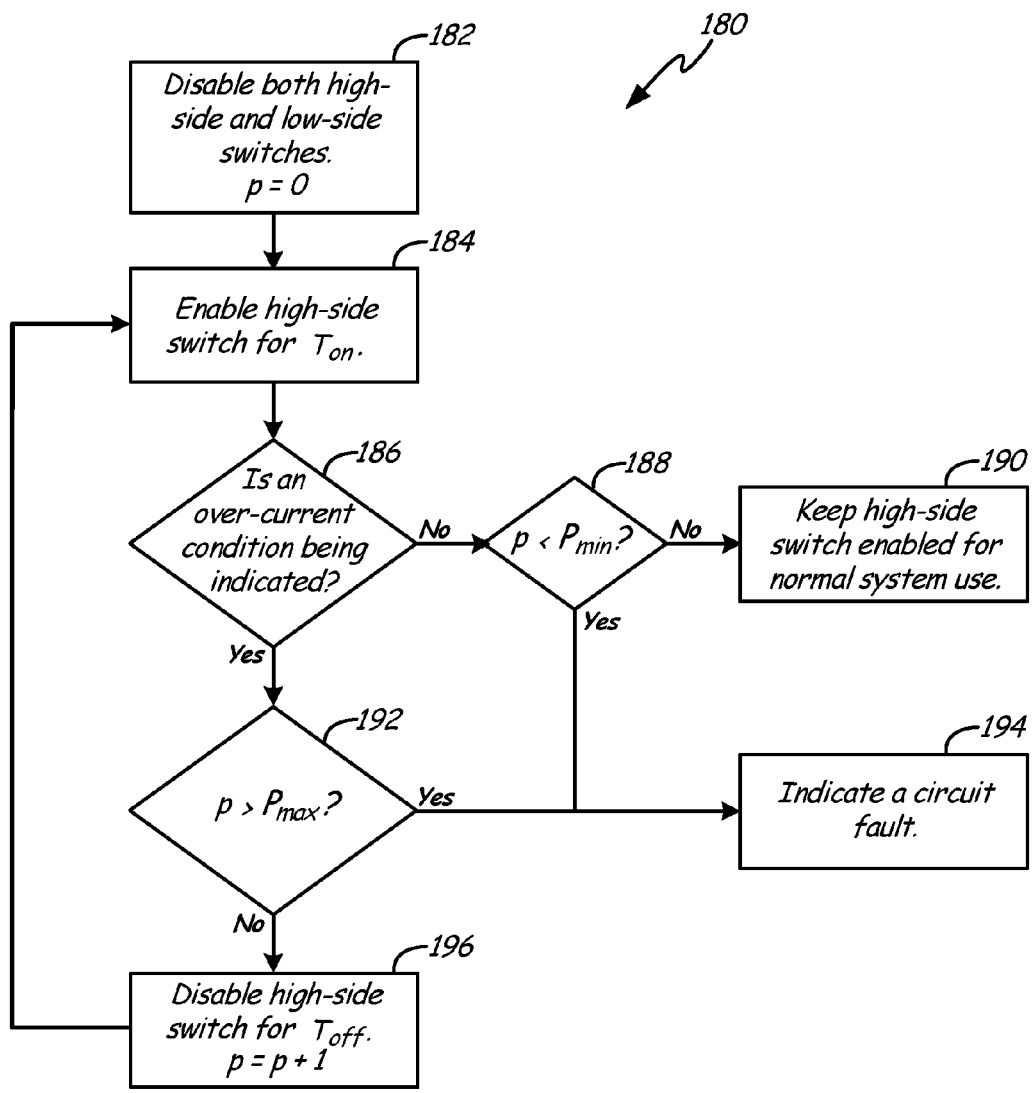
FIG. 5 is a flow chart illustrating an alternate method of enabling a high-side switch according to an embodiment of the present invention.

FIG. 5 is a flowchart illustrating an alternate method 180 of enabling a high-side switch for normal system operation according to an embodiment of the present invention. At step 182, high-side switch 14 and low-side switch 16 are disabled. Microcontroller 12 tracks the number of times high-side switch 14 has been enabled (p). At step 184, high-side switch 14 is enabled for $T_{on}$. At step 186, it is determined if the signal on over-current line 22 has transitioned high. If it has, method 180 proceeds to step 188. If it has not, method 180 proceeds to step 192. At step 188, it is determined if the number of times high-side switch 14 has been enabled (p) is less than a predefined minimum number of pulses it should take to charge capacitor 20 ($P_{min}$). If it is, method 180 proceeds to step 194 and indicates a circuit fault. If it is not, method 180 proceeds to step 190 and enables high-side switch 14 for normal system operation. At step 192, it is determined if the number of times high-side switch 14 has been enabled (p) is greater than a predefined maximum number of pulses it should take to charge capacitor 20 ($P_{max}$). If it is, method 180 proceeds to step 194 and indicates a circuit fault. If it is not, method 180 proceeds to step 196. At step 196 high-side switch 14 is disabled for $T_{off}$ in order to not create a false over-current fault. Method 180 then returns to step 184. In the present embodiment, $T_{on}$ is equal to $T_{off}$. It may be advantageous in some systems to set the high-side switch disable time longer, for example, than the high-side switch enable time in order to further control or limit the average current into capacitor 20 and to limit the corresponding average circuitry power for the entirety of method 180.

In this way, the present invention describes an over-current fault detection system that has an ability to self-test the over-current fault detection in the field. Although the present invention has been described with reference to preferred embodiments, workers skilled in the art will recognize that changes may be made in form and detail without departing from the spirit and scope of the invention.

The invention claimed is:

1. A system for testing over-current fault detection comprising:
   a first switch to connect a voltage to a load and a capacitor;
   a monitor circuit that monitors a current from the first switch to the load;
   a microcontroller configured to test over-current fault detection by enabling the first switch to produce an in-rush current through the capacitor, wherein the microcontroller indicates a successful test of the over-current fault detection if the in-rush current is greater than a reference value.

2. The system of claim 1, further comprising a second switch configured to connect the load to ground.

3. The system of claim 1, wherein the monitor circuit monitors current from the first switch to the load by monitoring voltage across a reference resistor.

4. The system of claim 3, wherein the monitor circuit comprises:
   a difference amplifier that amplifies the voltage across the reference resistor; and
   a comparator that compares an output of the difference amplifier with a reference voltage, wherein an output of the comparator indicates when the output of the difference amplifier is greater than the reference voltage.

5. The system of claim 4, wherein the microcontroller indicates an over-current fault and disables the first switch after the comparator's output has indicated that the output of the difference amplifier is greater than the reference voltage for greater than a predefined amount of time.

6. The system of claim 1, wherein the microcontroller is further configured to modulate the first switch on and off in order to charge the capacitor without creating an over-current fault condition.

7. A method for testing over-current fault detection comprising:
   a. enabling a first switch for a predefined time in order to generate an in-rush current through a capacitor;
   b. monitoring the in-rush current using a monitor circuit; and
   c. indicating, by a controller, a successful test of the over-current fault detection if the in-rush current is larger than a reference value during the predefined time.

8. The method of claim 7, further comprising:
   d. repeating steps a and b if both a successful test was not indicated in step c, and steps a and b have not been completed a predefined number of times; and
   e. indicating a failed test if an over-current fault condition was not indicated and steps a and b have been completed the predefined number of times.

9. The method of claim 7, wherein monitoring the in-rush current using a monitor circuit comprises:
   inputting voltage on each side of a resistor into a difference amplifier, wherein the resistor is connected between the first switch and the capacitor;
   comparing an output of the difference amplifier with a reference voltage using a comparator; and
   inputting an output of the comparator to a microcontroller.

10. The method of claim 9, wherein the output of the comparator indicates that the in-rush current is larger than the reference value.

11. The method of claim 7, wherein the method further comprises enabling a second switch for a short time period to discharge the capacitor prior to performing step a.

* * * * *